(12) United States Patent
Cervin-Lawry et al.

(10) Patent No.: US 7,981,759 B2
(45) Date of Patent: Jul. 19, 2011

(54) LOCAL OXIDATION OF SILICON PLANARIZATION FOR POLYSILICON LAYERS UNDER THIN FILM STRUCTURES

(75) Inventors: Andrew Cervin-Lawry, Oakville (CA); Mircea Capanu, St. Catherines (CA)

(73) Assignee: Paratek Microwave, Inc., Nashua, NH (US)

( * ) Notice: Subject to any disclaimer, the term of this patent is extended or adjusted under 35 U.S.C. 154(b) by 939 days.

(21) Appl. No.: 11/776,116

(22) Filed: Jul. 11, 2007

(65) Prior Publication Data

US 2009/0017591 A1    Jan. 15, 2009

(51) Int. Cl.
   *H01L 21/20* (2006.01)
(52) U.S. Cl. .......... 438/384; 257/E21.004; 257/E21.553
(58) Field of Classification Search .................. 438/439, 438/384; 257/E21.004, E21.553
   See application file for complete search history.

(56) References Cited

U.S. PATENT DOCUMENTS

| | | |
|---|---|---|
| 3,544,858 A | 12/1970 | Kooi |
| 3,911,471 A | 10/1975 | Kooi et al. |
| 4,373,965 A | 2/1983 | Smigelski |
| 5,151,381 A | 9/1992 | Liu et al. |
| 5,393,694 A | 2/1995 | Mathews |
| 5,465,003 A | 11/1995 | Lur et al. |
| 5,612,249 A | 3/1997 | Sun et al. |
| 5,679,599 A | 10/1997 | Mehta |
| 5,745,335 A | 4/1998 | Watt |
| 5,814,564 A * | 9/1998 | Yao et al. ....................... 438/734 |
| 6,277,684 B1 * | 8/2001 | Hayashi et al. ........ 257/E21.564 |
| 7,224,040 B2 * | 5/2007 | Koutsaroff et al. ... 257/E21.208 |
| 7,557,428 B2 * | 7/2009 | Kunitomo et al. ............ 257/533 |

FOREIGN PATENT DOCUMENTS

JP        60-189218    *  9/1985

\* cited by examiner

*Primary Examiner* — Matthew C. Landau
*Assistant Examiner* — Sun M Kim
(74) *Attorney, Agent, or Firm* — Guntin Meles & Gust, PLC; Andrew Gust

(57) ABSTRACT

In accordance with the teachings described herein, a method for fabricating a patterned polysilicon layer having a planar surface may include the steps of: depositing a polysilicon film above a substrate material; depositing an oxide-resistant mask over the polysilicon film; patterning and etching the oxide-resistant mask to form a patterned mask layer over the polysilicon film, such that the polysilicon film includes masked and unmasked portions; etching the unmasked portions of the polysilicon film for a first amount of time; oxidizing the etched polysilicon film for a second amount of time to form an oxide layer that defines the patterned polysilicon layer; and removing the patterned mask layer; wherein the first and second amounts of time are selected such that the oxide layer and the patterned polysilicon layer have about the same thickness and form a planar surface.

20 Claims, 7 Drawing Sheets

LOCAL OXIDATION OF SILICON PLANARIZATION FOR POLYSILICON LAYERS UNDER THIN FILM STRUCTURES

BACKGROUND AND SUMMARY

Thin film devices, such as micro-electromechanical systems (MEMS) and thin film capacitors, typically require an atomically smooth surface for high yield manufacturing. These thin film devices are generally made from layers deposited and patterned in a series of successive steps, one layer at a time, that build up the final device structure. The topography created on the surface by underlying patterned films, such as polysilicon, can cause significant problems for the subsequent formation and patterning of layers, such as stringers, striations in spin-on films and focus problems in photolithography. Previous efforts to reduce these and other problems associated with depositing thin film layers on top of a patterned polysilicon have included limiting the thickness of the polysilicon layer, typically to 1 um. It would be advantageous to provide an extremely planar surface on a patterned polysilicon layer in order to reduce or eliminate the problems associated with forming layers on top of patterned films.

In accordance with the teachings described herein, a method for fabricating a patterned polysilicon layer having a planar surface may include the steps of depositing a polysilicon film above a substrate material; depositing an oxide-resistant mask over the polysilicon film; patterning and etching the oxide-resistant mask to form a patterned mask layer over the polysilicon film, such that the polysilicon film includes masked and unmasked portions; etching the unmasked portion of the polysilicon film for a first amount of time to define a pattern in the masked portion of the polysilicon film; oxidizing the etched polysilicon film for a second amount of time to form an oxide layer that is coplanar with the patterned polysilicon film; and removing the patterned mask layer; wherein the first and second amounts of time are selected such that the oxide layer and the patterned polysilicon film have about the same thickness and form a planar surface.

A thin film capacitor having an integrated polysilicon decoupling resistor may include a substrate, a patterned polysilicon layer and a thin film capacitor. The patterned polysilicon layer may be fabricated on the substrate to form the integrated polysilicon decoupling resistor, the patterned polysilicon layer having a planar surface. The thin film capacitor may be fabricated on the planar surface of the patterned polysilicon layer. The patterned polysilicon layer may be fabricated by etching masked portions of a deposited polysilicon film for a first amount of time to define a pattern in the polysilicon film, and oxidizing the etched polysilicon film for a second amount of time to form an oxide layer that is coplanar with the patterned polysilicon film, the first and second amounts of time being selected such that the oxide layer and the patterned polysilicon film have about the same thickness and form the planar surface.

A MEMS beam resonator may include a substrate, a first patterned polysilicon layer, and a second patterned polysilicon layer. The first patterned polysilicon layer may be fabricated on the substrate and may have a planar surface. The second patterned polysilicon layer may be spaced from the first patterned polysilicon layer by a small gap, wherein the small gap is fabricated using a sacrificial oxide that is formed on the planar surface of the first patterned polysilicon layer. The first patterned polysilicon layer may be fabricated by etching masked portions of a deposited polysilicon film for a first amount of time to define a pattern in the polysilicon film, and oxidizing the etched polysilicon film for a second amount of time to form an oxide layer that is coplanar with the patterned polysilicon film, the first and second amounts of time being selected such that the oxide layer and the patterned polysilicon film have about the same thickness and form the planar surface.

DETAILED DESCRIPTION

Figure 1:
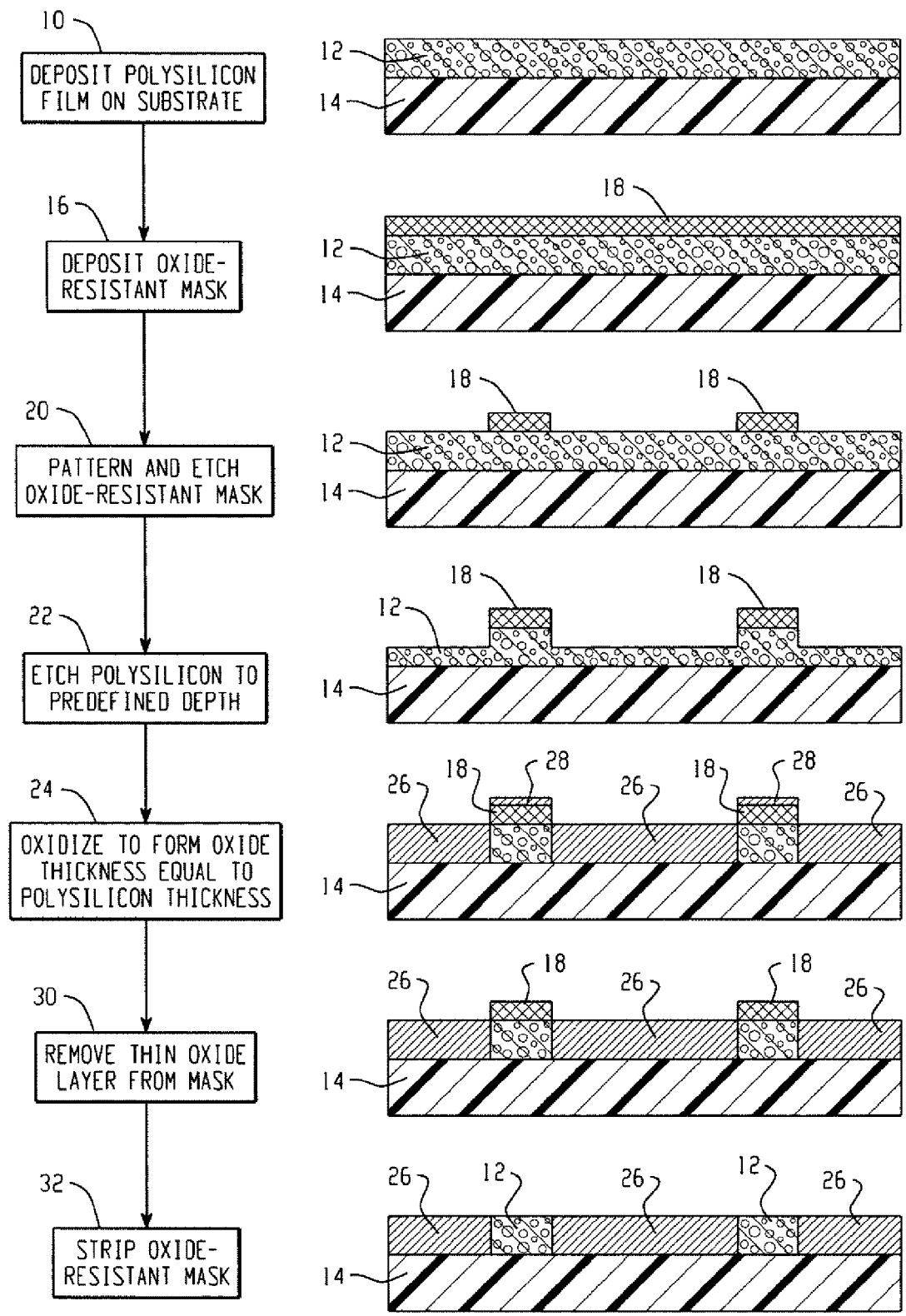
FIG. 1 depicts and example process for fabricating a patterned polysilicon layer having a planar surface.

FIG. 1 depicts an example process for fabricating a patterned polysilicon layer having a planar surface. The steps of the process are illustrated on the left-hand side of FIG. 1, and examples of the resulting structures are depicted on the right-hand side of FIG. 1. In step 10, a polysilicon film 12 is deposited above a substrate material 14 to a desired thickness. The substrate material 14 should be capable of withstanding high oxidation temperatures (e.g., up to 1100° C.). the substrate 14 may, for example, be silicon, alumina, ceramic, sapphire, or some other suitable material.

In step 16, an oxide-resistant mask 18, such as silicon nitride, is deposited over the polysilicon layer 12. The oxide-resistant mask 18 is then patterned and etched in step 20 to form the desired pattern for the polysilicon layer 12. The oxide-resistant mask 18 may, for example, be patterned and etched using conventional photolithography and dry etching techniques.

In step 22, the unmasked portions of the polysilicon layer 12 are etched to a predetermined thickness, which will typically be about half of the original thickness of the polysilicon film. A high-temperature oxidation is then performed in step 24. The oxidation consumes the entire thickness of the partially-etched polysilicon layer 12 and forms a layer of silicon dioxide 26 having the same thickness as the masked polysilicon layer. In step 30, a very thin layer of oxide 28 formed over the mask 18 during oxidation is removed, for example using a short wet etch. The oxide-resistant mask 18 is then removed in step 32, for example using a bath of hot phosphoric acid.

The duration of the polysilicon etch (step 22) and the duration of the oxidation (step 24) are controlled to ensure that the oxide 26 is grown to about the same thickness as the polysilicon 12. This results in a very planar surface of silicon dioxide 26 and patterned polysilicon 12. Preferably, the process is controlled to achieve an oxide thickness that is equal to the polysilicon thickness with a variance of less than 10% of the polysilicon thickness (e.g., within +/−0.02 um for a 0.2 um polysilicon film). In certain applications, however, a higher variance may be acceptable, such as less than 30% of the polysilicon thickness.

The planarization process depicted in FIG. 1 may, for example, be used to create an extremely planar surface on a patterned polysilicon layer needed for thin film devices, such as MEMS oscillators, decoupling resistors for a capacitor bias network, or other devices. Moreover, the technique allows for the planarization of a wide range of polysilicon thicknesses, and can be used in combination with other thin film techniques such as resist, spin-on-glass (SOG), etch-back, chemical mechanical polishing (CMP), or others.

Figure 2A:
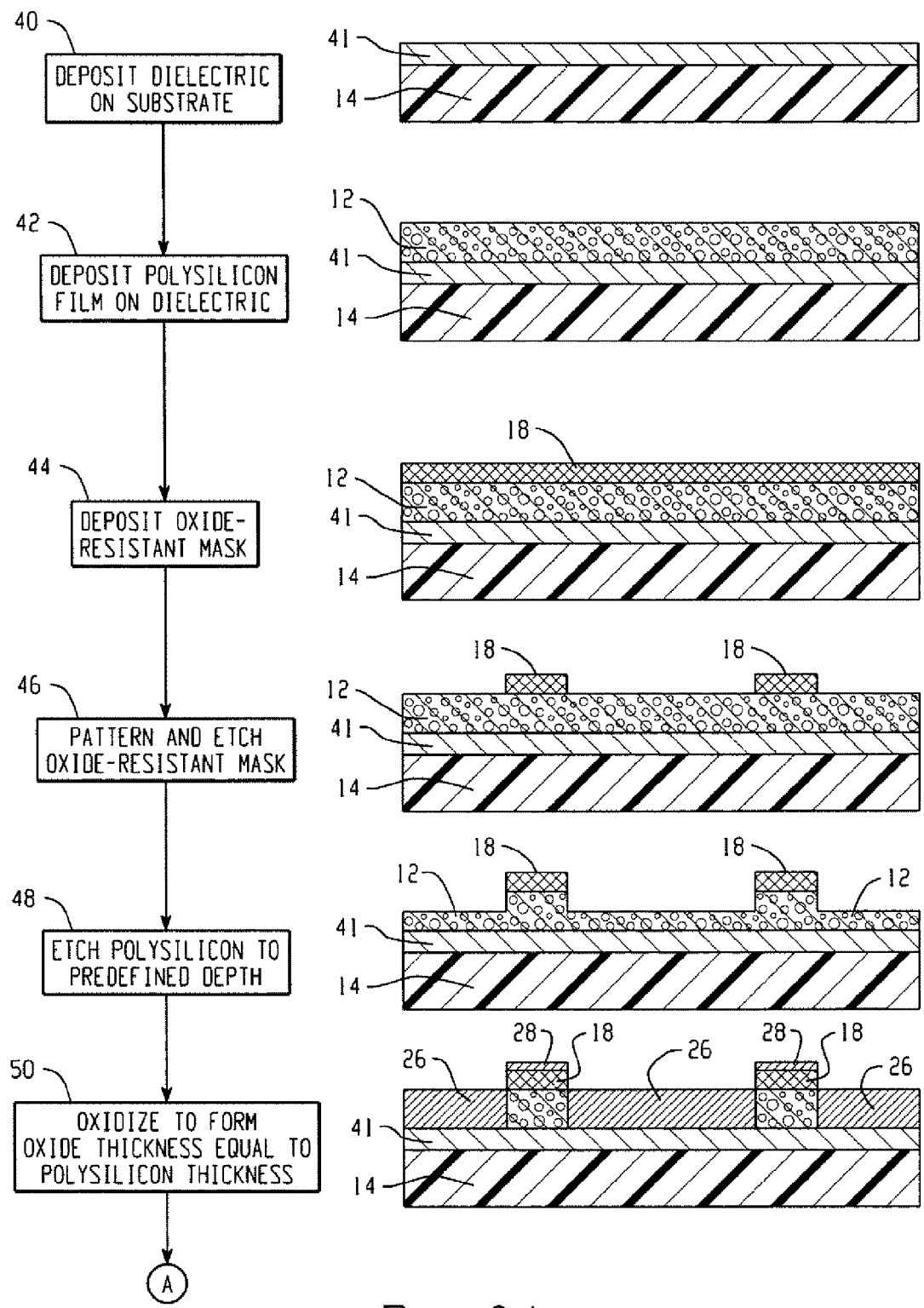
FIGS. 2A and 2B depicts an example process for fabricating a thin film device having multiple planarized polysilicon layers.
Figure 2B:
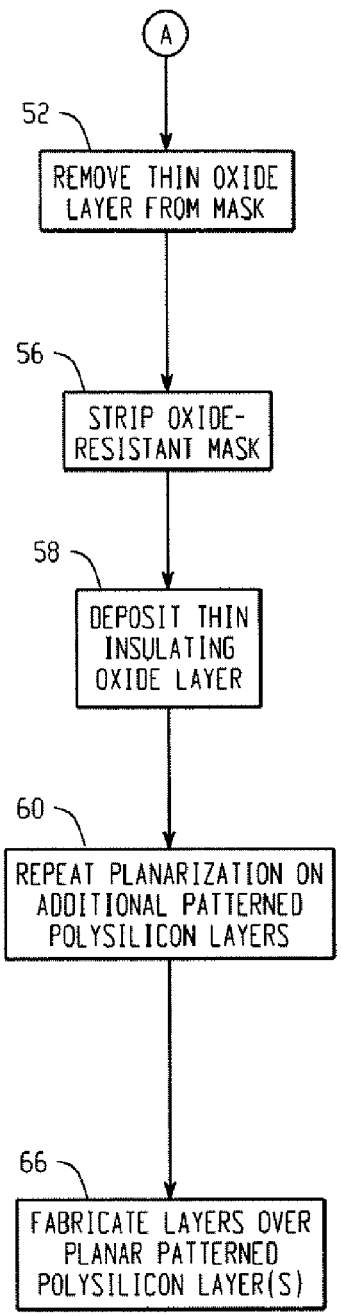
Figure 2B:
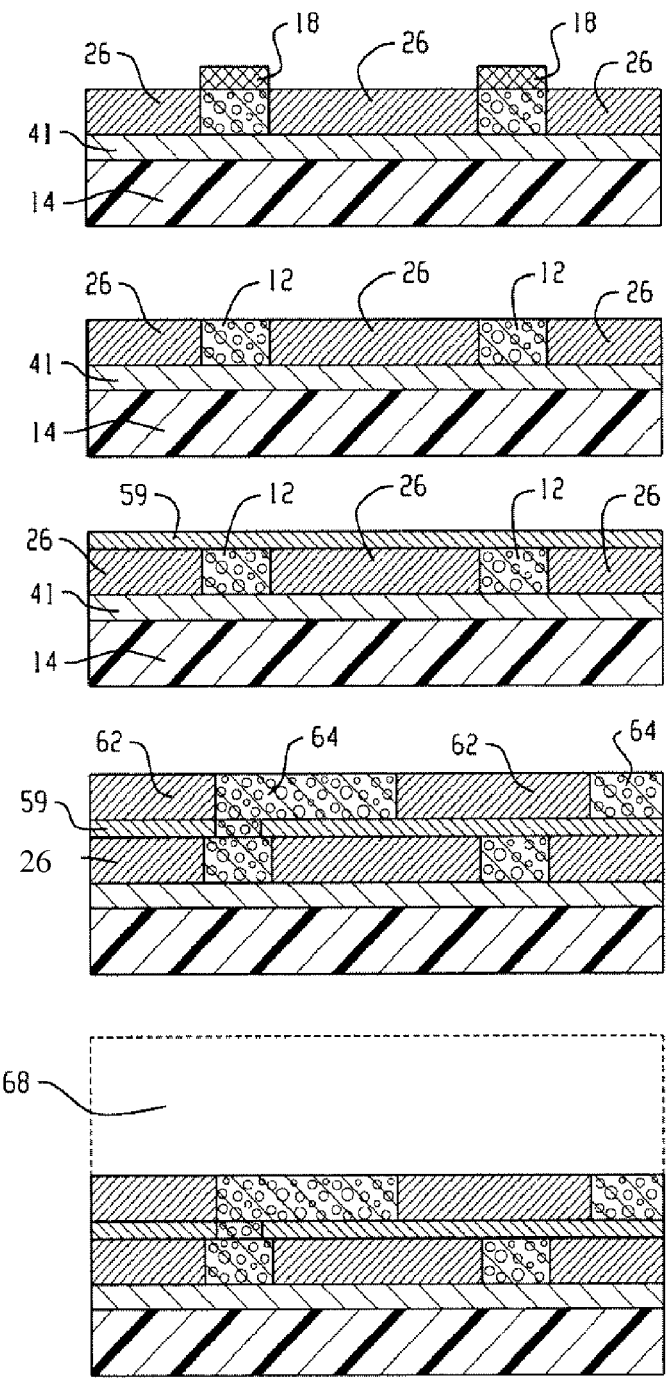

FIGS. 2A and B depicts an example process for fabricating a thin film device having multiple planarized polysilicon layers. The steps of the process are illustrated on the left-hand side of FIGS. 2A and B, and examples of the resulting structures are depicted on the right-hand side of FIGS. 2A and B. In step 40, a dielectric layer 41 is deposited over a substrate material 14. The dielectric 41 may, for example, be a low temperature silicon dielectric (LTO). The substrate 14 may, for example, be silicon, alumina, ceramic, sapphire, or some other suitable material. If the substrate 14 is silicon, however, an insulating film of silicon dioxide may be needed.

In step 42 a polysilicon film 12 is deposited over the dielectric 41 to a desired thickness. Then, an oxide-resistant mask 18, such as silicon nitride, is deposited over the polysilicon layer 12 in step 44, and the mask 18 is patterned and etched in step 46 to form the desired pattern for the polysilicon layer 12. The oxide-resistant mask 18 may, for example, be patterned and etched using conventional photolithography and dry etching techniques.

In step 48, the unmasked portions of the polysilicon layer 12 are etched to a predetermined thickness, which will typically be about half of the original thickness of the polysilicon film. A high-temperature oxidation is then performed in step 50. The oxidation consumes the entire thickness of the partially-etched polysilicon layer 12 and forms a layer of silicon dioxide 26 having about the same thickness as the masked polysilicon layer. In step 52, a very thin layer of oxide 28 formed over the mask 18 during oxidation is removed, for example using a short wet etch. The oxide-resistant mask 18 is then removed in step 56, for example using a bath of hot phosphoric acid. The thickness of the partially-etched polysilicon (step 48) and the duration of the oxidation (step 50) are controlled to ensure that the oxide 26 is grown to substantially the same thickness as the polysilicon 12, resulting in a very planar surface of silicon dioxide 26 and patterned polysilicon 12.

In step 58, a thin layer of oxide is deposed to insulate the polysilicon 12 from any devices or layers fabricated above it. In this example in step 60, a second patterned polysilicon layer 64 is added and planarized with an oxide layer 62 by repeating the process in steps 42-56. Another layer of deposited oxide may also be added to insulate the second patterned polysilicon layer 64 from any devices fabricated on top. Additional patterned polysilicon layers may also be added.

Finally, one or more thin film devices 68 are fabricated on the very smooth surface formed by the patterned polysilicon 64 and oxide 62 in step 66. For instance, the planarized polysilicon/oxide surface may be used to support MEMS beam resonators, BST thin film capacitors, or other thin film devices that require very good planarization of a bottom layer or layers of polysilicon.

Figure 3A:
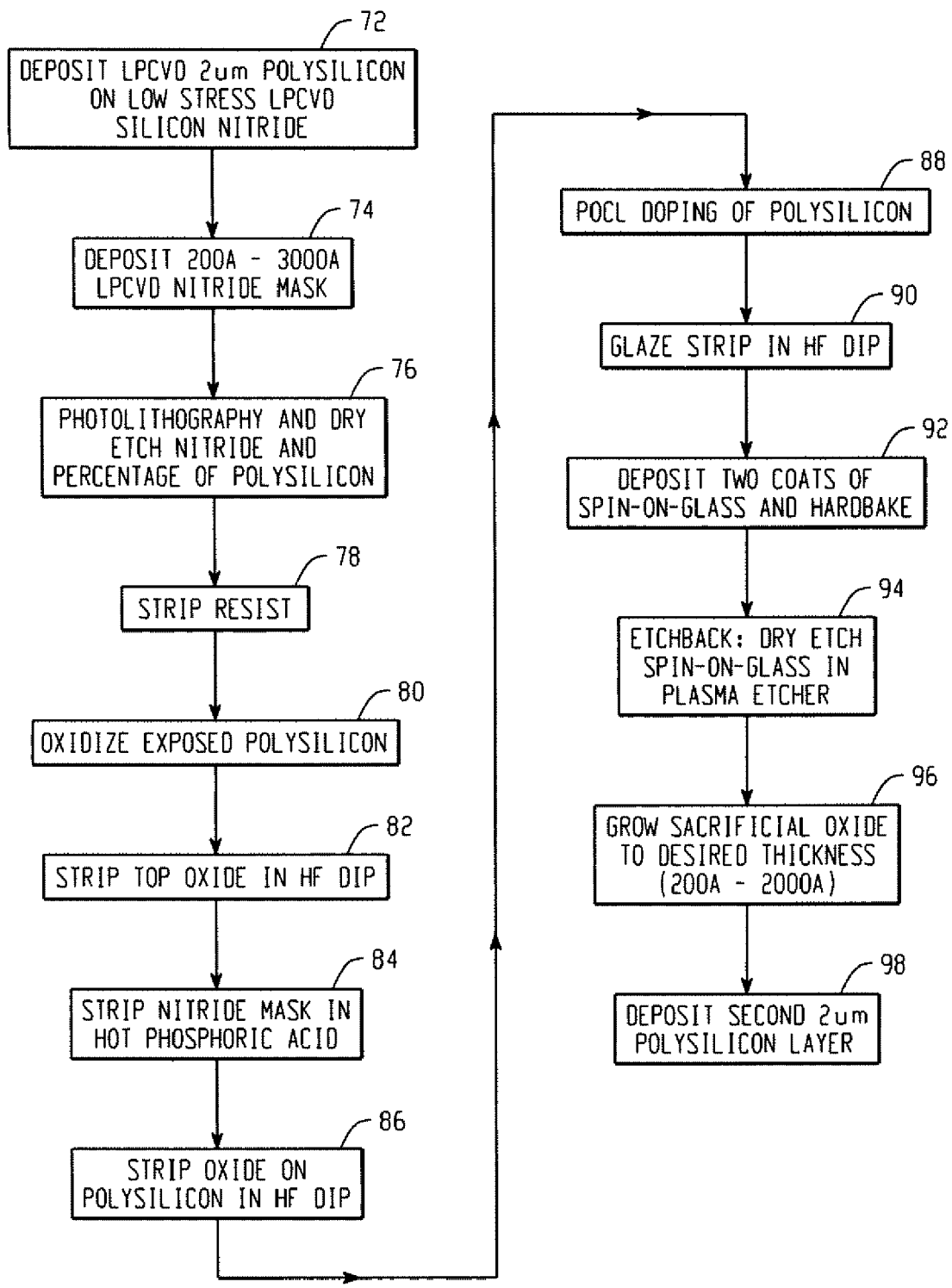
FIG. 3A is a flow diagram that depicts an example planarization process for MEMS beam resonators.

FIG. 3A is a flow diagram that depicts an example planarization process for MEMS beam resonators. The process depicted in FIG. 3A fully planarizes the lower polysilicon layer of the beam resonator, creating a very smooth and well-defined surface. This enables good control of the sacrificial gap (e.g., 200-400 A) required in some MEMS devices.

In step 72, a 2 um polysilicon film is deposited on a silicon nitride (SixNy) substrate using low pressure chemical vapor deposition (LPCVD). A 200 A-3000 A LPCVD nitride is then deposited on the polysilicon to form an oxide mask in step 74. The oxide mask is preferably about 3000 A. In step 76, the oxide mask is patterned and etched using standard photolithography and dry etching techniques. The exposed polysilicon is then etched to a predetermined thickness in step 78. The polysilicon is preferable etched to remove about 1.2 um from a 2 um polysilicon film. The polysilicon may be etched to the desired thickness by controlling the duration of the etch, using an un-doped polysilicon wafer to measure the etch rate. After the polysilicon etch is complete, the photoresist is stripped, and the method proceeds to step 80.

In step 80, the exposed polysilicon is field oxidized down to the underlying surface to form an oxide of a desired thickness, such as 0.8 um for a polysilicon thickness of 2 um to form 2 um of silicon dioxide. The top oxide is then stripped in step 82, for example in a 10:1 hydrofluoric acid dip for 4 minutes. The nitride mask is stripped in step 84, for example in a 160° phosphoric acid bath for 2 hours. The oxide on top of the polysilicon is stripped in step 86, for example in a 10:1 hydrofluoric acid bath for 4 minutes.

In step 88 the polysilicon is doped with phosphorous oxychloride (POCL) for a few hours at 1030° C. to reduce the sheet resistance. A glaze strip is then performed in step 90, for example in a 10:1 hydrofluoric acid dip for 4 minutes.

Two coats of spin-on-glass (SOG) are applied in step 94, for instance to form a total thickness of 2600 A. Each coat of SOG should be hard baked, for example on a hot plate at 250° C. In step 94 the SOG is dry etched to a 15% over etch (OE) in a plasma etcher to smooth the pattern edges, removing any "birds beaks."

A sacrificial oxide is grown in step 96 to form the release layer for the beam resonator. The oxide may, for example, be grown at 1050° C. to get a very uniform thickness at a desire value (e.g., 200 A-2000 A). Finally, in step 98 a second 2 um polysilicon layer is deposited over the sacrificial oxide, such that the two polysilicon layers are spaced apart by the thin sacrificial oxide layer.

Figure 3B:
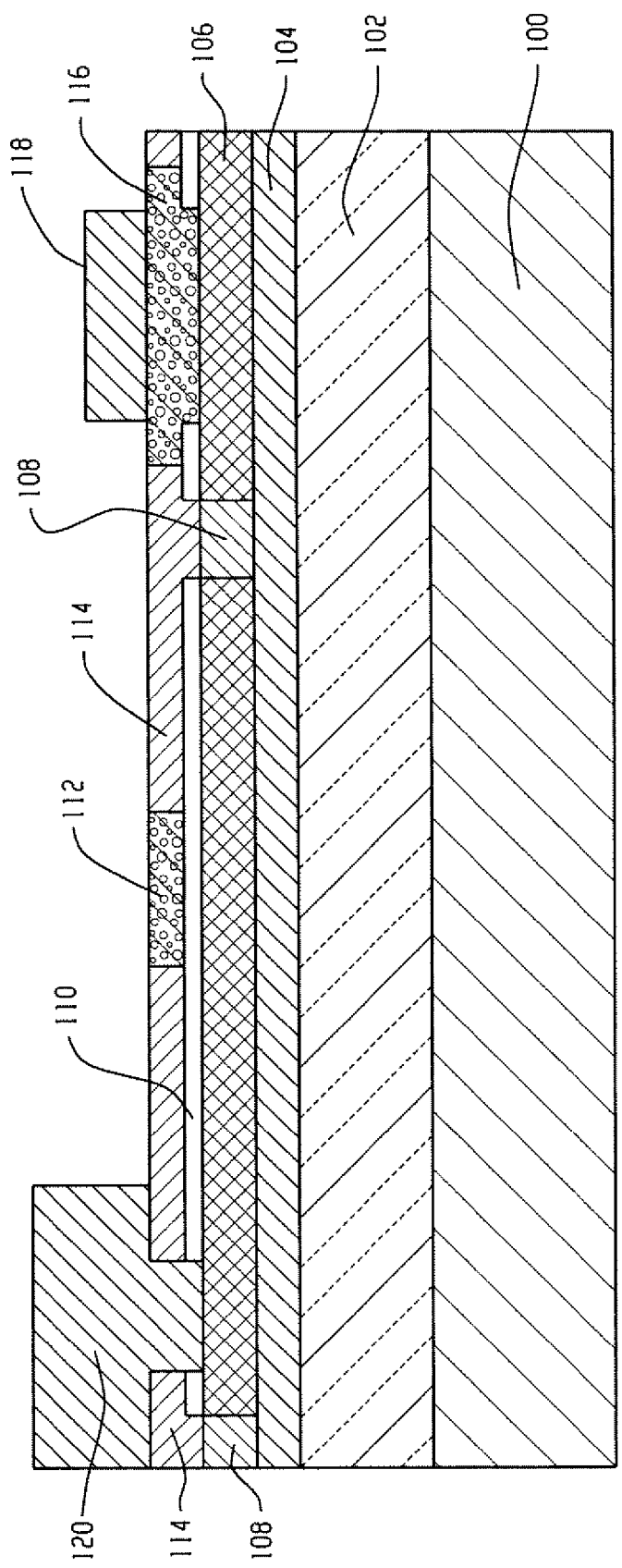
FIG. 3B is a cross-sectional diagram depicting an example MEMS beam resonator that is fabricated using the process shown in FIG. 3A.

FIG. 3B is a cross-sectional diagram depicting an example MEMS beam resonator that is fabricated using the process shown in FIG. 3A. The resonator structure is fabricated on a high resistivity silicon wafer substrate 100 that is covered with an insulating layer (e.g, 3-6 um) of thermal silicon dioxide 102 and a layer of low stress LPCVD silicon rich nitride 104. A first polysilicon layer 106 is fabricated over the nitride 104 and is patterned and planarized with an oxide layer 108, as described above with reference to FIG. 3A. A second patterned polysilicon layer 112 and oxide 114 is fabricated over a sacrificial oxide which is released to form a gap 110 between the first and second polysilicon layers 106, 112. The illustrated example also includes a portion 116 of the second patterned polysilicon layer that is fabricated directly on top of the first polysilicon layer 106, forming an electrical connection between portions of the two patterned polysilicon layers. Metal pads 118 and 120 (e.g., Aluminum pads) are deposited over the second patterned polysilicon and oxide layers 112, 114, 116, with one pad 118 in direct electrical contact with a portion 116 of the second polysilicon layer and the other pad 120 connected to the first polysilicon layer 106 by a metal-filled via.

Figure 4A:
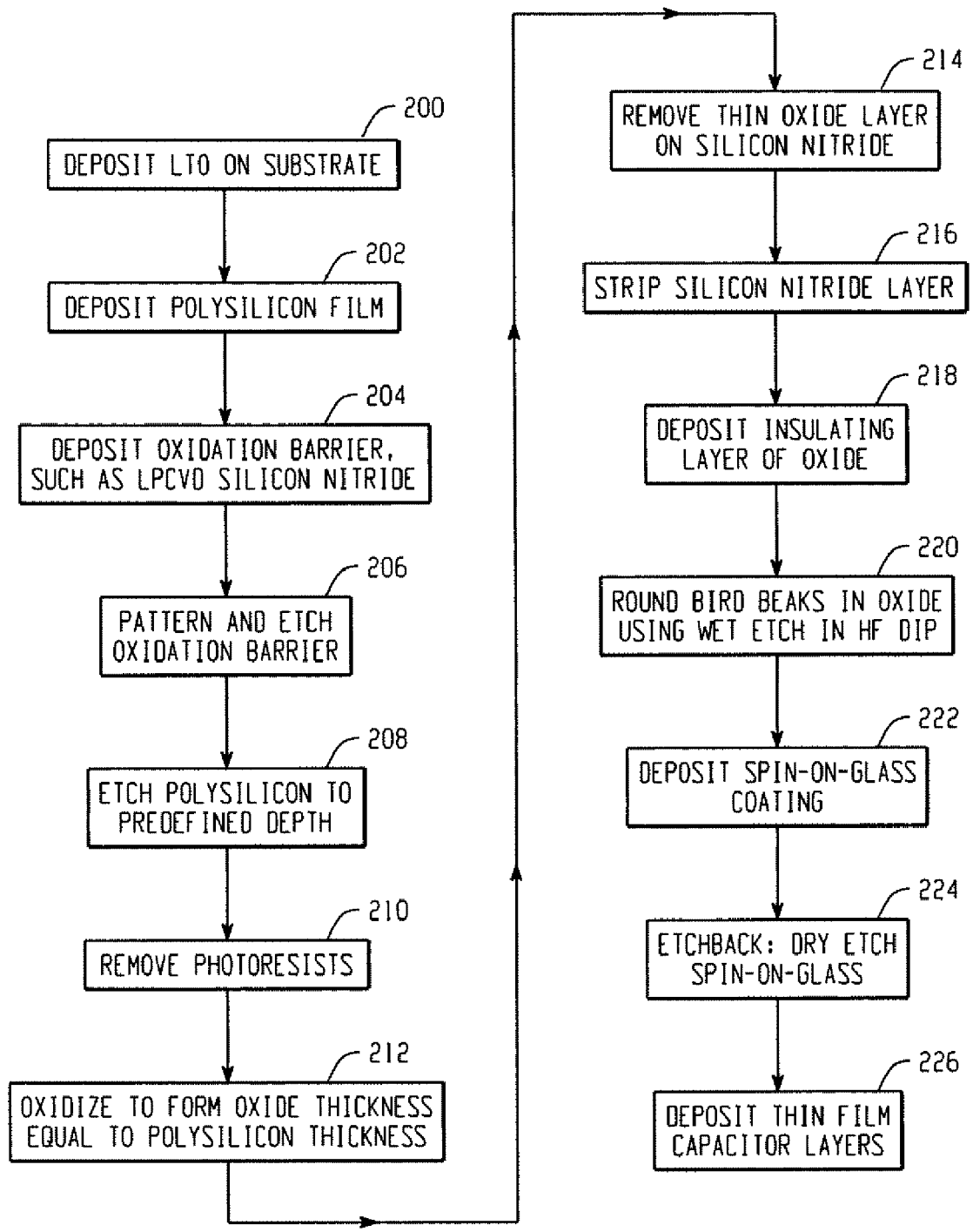
FIG. 4A is a flow diagram that depicts an example planarization process for a thin film capacitor with integrated polysilicon decoupling resistors.

FIG. 4A is a flow diagram that depicts an example planarization process for a thin film capacitor with integrated polysilicon decoupling resistors. When fabricating a thin film capacitor using a spin-on technique, the surface should be made planar before spinning. The process depicted in FIG.

4A greatly improves the surface quality and process cost relative to other planarizing techniques, such as etch-back and chemical mechanical planarization (CMP).

In step 200, a low-temperature silicon dioxide (LTO) film (e.g., 0.5 um) is deposited over a substrate material, such as silicon, high resistivity silicon, alumina, sapphire, or other suitable substrate material. A 0.5 um polysilicon film substrate is then deposited over the LTO in step 202, for example using LPCVD. At step 204, a 0.3 um LPCVD silicon nitride layer is deposited over the polysilicon film to form an oxide barrier.

In step 206, the silicon nitride oxide mask is patterned and etched using standard photolithography and dry etching techniques to form the desired pattern for the polysilicon decoupling resistors. The exposed polysilicon is then etched to a predetermined thickness at step 208, for example the polysilicon film may be etched to a thickness of 0.2 um. Organic photoresist layers from the photolithography step are removed at step 210.

In step 212, the exposed polysilicon (e.g., 0.2 um) is oxidized down to the underlying surface to form an oxide thickness substantially equal to the polysilicon thickness (e.g., 0.5 um). The polysilicon may, for example, be oxidized at 950°-1050° C. After a short wet etch to remove the very thin oxide formed on top of the silicon nitride (step 214), the nitride is stripped (step 216) to leave a very planar surface of silicon dioxide and patterned polysilicon. The nitride may, for example, be stripped in a bath of hot phosphoric acid. A subsequent layer of deposited oxide may then be added at step 218 to insulate the polysilicon from devices to be formed on top of the polysilicon.

In step 220, the edges of the polysilicon pattern are smoothed to remove any "bird's beaks" using a wet etch in a 10:1 hydrofluoric acid dip for about 2 minutes. A spin-on-glass (SaG) coating is then added in step 222, for instance to form a 1300 A SOG layer. For example, the SOG may be hard baked on a hot plate at 250° C. In step 224, the SaG is dry etched to 15% over etch (OE), for example using a plasma etcher. Finally, the thin film capacitor layers are fabricated on the planarized surface at step 226. For instance, a high frequency RF tunable Pt/BST/Pt capacitor may be fabricated using a spin-on BST dielectric.

Figure 4B:
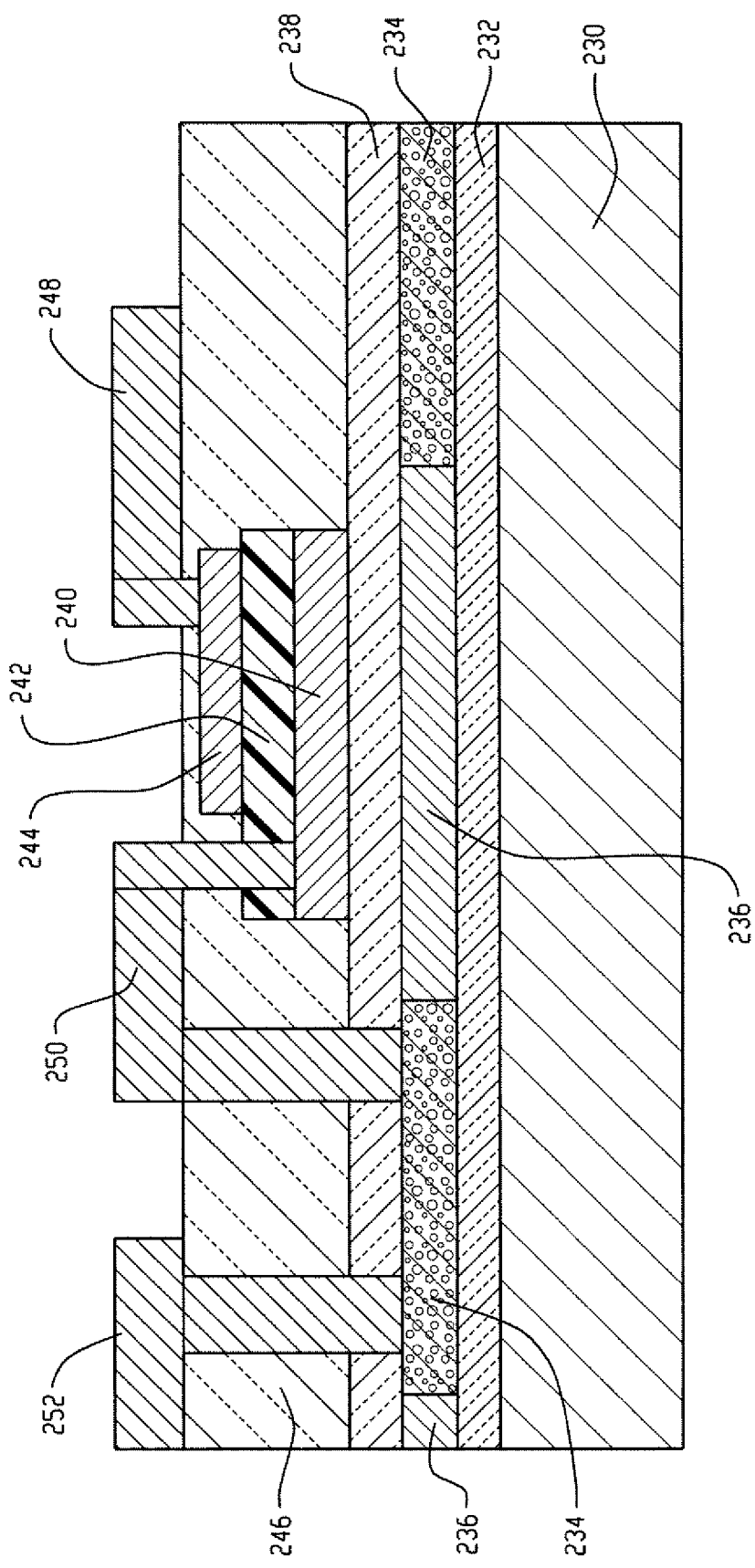
FIG. 4B is a cross-sectional diagram depicting an example thin film capacitor circuit having an integrated polysilicon resistor that is fabricated using the process shown in FIG. 4A.

FIG. 4B is a cross-sectional diagram depicting an example thin film capacitor circuit having an integrated polysilicon resistor that is fabricated using the process shown in FIG. 4A. The thin film circuit is fabricated on an Alumina ($Al_2O_3$) substrate 230 covered with an insulating layer of silicon dioxide 232. A polysilicon layer 234 is deposited over the insulating oxide 232 and is patterned and planarized with an oxide layer 236, as described above with reference to FIG. 4A, to form one or more polysilicon resistors. An insulating silicon dioxide layer 238 is deposited over the planarized polysilicon and oxide layers 234, 236, and the thin film capacitor is formed above the insulating oxide by depositing a layer of dielectric material 242, such as barium strontium titanate (BST), between two electrode layers 240, 244 (e.g., Pt). The thin film capacitor is insulated with another layer of silicon dioxide 246. The thin film capacitor and polysilicon resistors are electrically connected using metallic interconnect layers and metallic (e.g., Al) pads 248, 250, 252. In the illustrated embodiment, the capacitor circuit includes a first pad 248 for providing an RF output, a second pad 250 for providing an R input, and a third pad 252 for providing a DC bias. In this example, a polysilicon resistor is coupled in series between the DC bias and the bottom electrode of the thin film capacitor, providing a decoupling resistor.

This written description uses examples to disclose the invention, including the best mode, and also to enable a person skilled in the art to make and use the invention. The patentable scope of the invention may include other examples that occur to those skilled in the art. For instance, in addition to planarizing patterned polysilicon layers, the techniques described herein may also be utilized for planarizing other patterned layers resistant to oxidation, such as Pt.

It is claimed:

1. A method for fabricating a patterned polysilicon layer having a planar surface, comprising:
   depositing a polysilicon film above a substrate material;
   depositing an oxide-resistant mask over the polysilicon film;
   patterning and etching the oxide-resistant mask to form a patterned mask layer over the polysilicon film, such that the polysilicon film includes masked and unmasked portions;
   etching the unmasked portion of the polysilicon film for a first amount of time to define a pattern in the masked portion of the polysilicon film;
   oxidizing the etched polysilicon film for a second amount of time to form an oxide layer that is coplanar with the patterned polysilicon film;
   removing the patterned mask layer;
   fabricating a tunable capacitor over the patterned polysilicon layer;
   wherein the first and second amounts of time are selected such that the oxide layer and the patterned polysilicon film have about the same thickness and form a planar surface.

2. The method of claim 1, further comprising:
   depositing a layer of dielectric material on the substrate material before depositing the polysilicon film, wherein the polysilicon film is deposited on the dielectric material.

3. The method of claim 1, further comprising:
   depositing one or more layers of spin-on-glass over the patterned polysilicon layer.

4. The method of claim 1, wherein the substrate material is selected from a group of substrate materials consisting of silicon, alumina, ceramic, and sapphire.

5. The method of claim 1, wherein the oxide-resistant mask is silicon nitride.

6. The method of claim 1, wherein the oxide-resistant mask is patterned using photolithography.

7. The method of claim 1, wherein the oxide-resistant mask is etched using a dry etching technique.

8. The method of claim 1, wherein the first amount of time is selected to etch the unmasked portions of the polysilicon film to about half of the thickness of the masked polysilicon film.

9. The method of claim 1, wherein the oxidation consumes the entire unmasked portion of the polysilicon film.

10. The method of claim 1, wherein the patterned polysilicon film is 0.2 um thick and the oxide layer is 0.2 um +/−0.02 um thick.

11. The method of claim 1, wherein the patterned mask layer is removed using phosphoric acid.

12. A method for fabricating a patterned polysilicon layer having a planar surface, comprising:
   depositing a polysilicon film above a substrate material;
   depositing an oxide-resistant mask over the polysilicon film;

patterning and etching the oxide-resistant mask to form a patterned mask layer over the polysilicon film, such that the polysilicon film includes masked and unmasked portions;

etching the unmasked portion of the polysilicon film for a first amount of time to define a pattern in the masked portion of the polysilicon film;

oxidizing the etched polysilicon film for a second amount of time to form an oxide layer that is coplanar with the patterned polysilicon film;

removing the patterned mask layer;

wherein the first and second amounts of time are selected such that the oxide layer and the patterned polysilicon film have about the same thickness and form a planar surface, wherein the patterned polysilicon layer forms one or more thin film resistors.

13. The method of claim 12, further comprising:
depositing a layer of dielectric material on the substrate material before depositing the polysilicon film, wherein the polysilicon film is deposited on the dielectric material.

14. The method of claim 12, further comprising:
depositing one or more layers of spin-on-glass over the patterned polysilicon layer.

15. The method of claim 12, wherein the substrate material is selected from a group of substrate materials consisting of silicon, alumina, ceramic, and sapphire.

16. The method of claim 12, wherein the oxide-resistant mask is silicon nitride.

17. The method of claim 12, wherein the oxide-resistant mask is patterned using photolithography.

18. The method of claim 12, wherein the oxide-resistant mask is etched using a dry etching technique.

19. The method of claim 12, wherein the first amount of time is selected to etch the unmasked portions of the polysilicon film to about half of the thickness of the masked polysilicon film.

20. The method of claim 12, wherein the oxidation consumes the entire unmasked portion of the polysilicon film.

* * * * *